(12) United States Patent
Ohkubo et al.

(10) Patent No.: US 7,800,668 B2
(45) Date of Patent: Sep. 21, 2010

(54) SOLID STATE IMAGING DEVICE INCLUDING A LIGHT RECEIVING PORTION WITH A SILICIDED SURFACE

(75) Inventors: Hiroaki Ohkubo, Kanagawa (JP); Yasutaka Nakashiba, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 958 days.

(21) Appl. No.: 11/634,084

(22) Filed: Dec. 6, 2006

(65) Prior Publication Data
US 2007/0139542 A1    Jun. 21, 2007

(30) Foreign Application Priority Data
Dec. 19, 2005   (JP)  .............. 2005-364345

(51) Int. Cl.
*H04N 5/335* (2006.01)
(52) U.S. Cl. .................................... 348/294
(58) Field of Classification Search ........... 257/228; 348/302, 311, 303, 304, 315, 294
See application file for complete search history.

(56) References Cited

U.S. PATENT DOCUMENTS

| | | | | |
|---|---|---|---|---|
| 4,656,519 A | * | 4/1987 | Savoye | 348/322 |
| 5,754,228 A | * | 5/1998 | Dyck | 348/266 |
| 6,028,002 A | * | 2/2000 | Thakur | 438/647 |
| 7,473,977 B2 | * | 1/2009 | Kitano et al. | 257/435 |
| 2006/0170009 A1 | * | 8/2006 | Kitano et al. | 257/236 |

FOREIGN PATENT DOCUMENTS

| | | |
|---|---|---|
| JP | 2-285683 | 11/1990 |
| JP | 3-296280 | 12/1991 |
| JP | 2000-0077641 | 3/2000 |
| JP | 2000-252452 | 9/2000 |
| JP | 2002-33469 | 1/2002 |

* cited by examiner

*Primary Examiner*—Jason Chan
*Assistant Examiner*—Nicholas G Giles
(74) *Attorney, Agent, or Firm*—McGinn IP Law Group, PLLC

(57) ABSTRACT

In a conventional solid state imaging device, there is a room for improvement in sensitivity. In order to solve the problem, a solid state imaging device includes a semiconductor substrate and a light receiving portion. The light receiving portion is provided adjacent to a surface layer on the surface (a first surface) side of the semiconductor substrate. The surface of the light receiving portion is silicided. The solid state imaging device is one in which light from an object to be imaged incident on the back side (a second surface) of the semiconductor substrate is photoelectric-converted inside the semiconductor substrate, the light receiving portion receives electric charge generated by the photoelectric conversion, and the above mentioned object to be imaged is imaged.

14 Claims, 2 Drawing Sheets

US 7,800,668 B2

SOLID STATE IMAGING DEVICE INCLUDING A LIGHT RECEIVING PORTION WITH A SILICIDED SURFACE

This application is based on Japanese Patent application NO. 2005-364345, the content of which is incorporated hereinto by reference.

BACKGROUND

1. Technical Field

The present invention relates to a solid state imaging device.

2. Related Art

A back side incident type solid state imaging device is disclosed in Japanese Laid-open patent publication No. 2002-33469. The solid state imaging device includes a semiconductor substrate and a light receiving portion formed on a surface layer thereof. Light from an object to be imaged incident on the back side (on the side opposite to the side where the light receiving portion is provided) of the semiconductor substrate is photoelectric-converted inside the semiconductor substrate. Then, the light receiving portion receives electric charge generated by the photoelectric conversion, and therefore imaging of the object to be imaged is performed.

There can be included Japanese Laid-open patent publication Nos. H3-296280, H2-285683, 2000-77641, and 2000-252452, respectively other than the above mentioned patent document, as related art documents related to the present invention. In Japanese Laid-open. patent publication Nos. H3-296280 and H2-285683, there is disclosed a back side incident type of solid state imaging device which images an object to be imaged on the basis of a principle different from the Japanese Laid-open patent publication Nos. 2002-33469. Furthermore, in Japanese Laid-open patent publication Nos. 2000-77641, and 2000-252452, there is disclosed a surface incident type of solid state imaging device.

However, in the solid state imaging device described in the Japanese Laid-open patent publication No. 2002-33469, there is a room for improvement in sensitivity. As a part of the reason for lowering sensitivity of such solid state imaging device, it may be included that a part of signal electric charge generated inside the semiconductor substrate disappears by recombination.

SUMMARY OF THE INVENTION

According to the present invention, there is provided a solid state imaging device, comprising: a semiconductor substrate; and a light receiving portion which is provided on a surface layer on a first surface side of the semiconductor substrate, and whose surface is silicided, wherein light from an object to be imaged incident on a second surface of the semiconductor substrate is photoelectric-converted inside the semiconductor substrate, the light receiving portion receives electric charge generated by the photoelectric conversion, and the object to be imaged is imaged. In this case, the second surface is the side opposite to the first surface (surface on the side where the light receiving portion is provided).

In the solid state imaging device, the surface of the light receiving portion is silicided. Therefore, the photoelectric conversion is not performed and light reached to the surface of the light receiving portion through the semiconductor substrate is reflected at the surface. This makes the reflected light reusable and therefore photoelectric conversion efficiency with respect to incident light increases.

According to the present invention, a solid state imaging device with excellent sensitivity can be realized.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
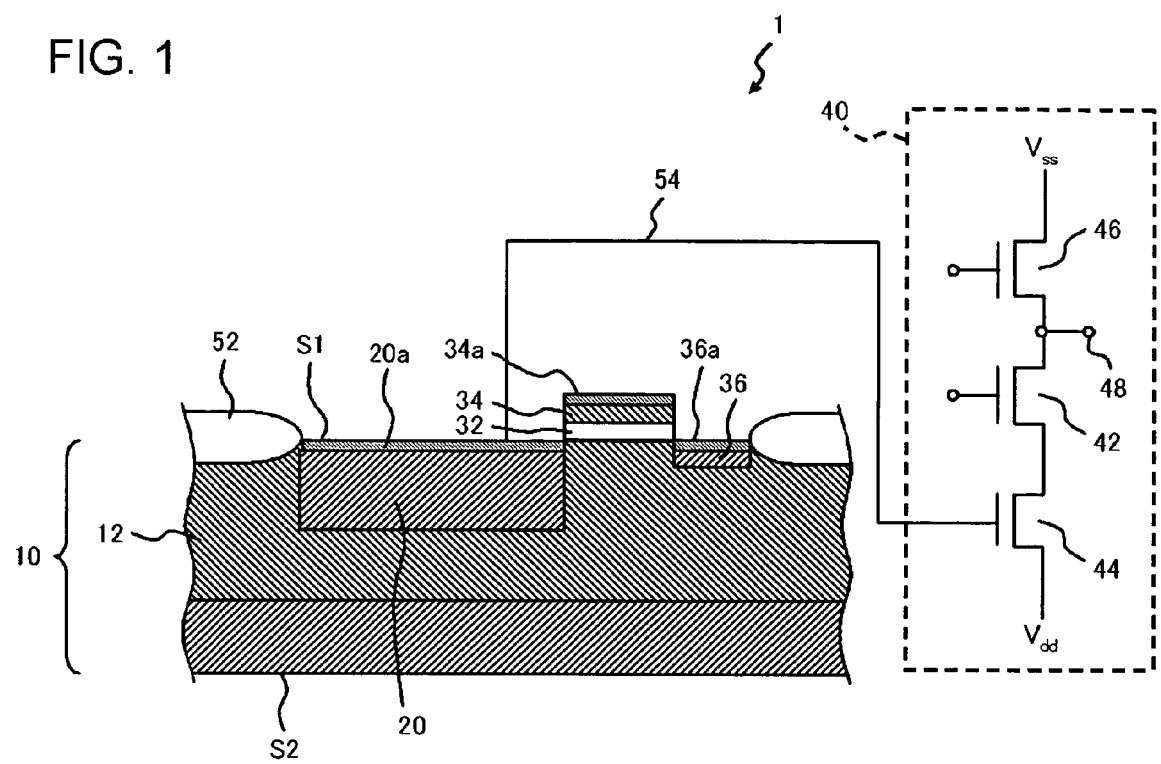
FIG. 1 is a cross-sectional view showing one embodiment of a solid state imaging device according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A preferred embodiment of a solid state imaging device according to the present invention will be described below with reference to the drawing. In addition, in the description of the drawings, the same reference characters are given to the same elements and their description will not be repeated.

FIG. 1 is a cross-sectional view showing one embodiment of the solid state imaging device according to the present invention. The solid state imaging device 1 includes a semiconductor substrate 10 and a light receiving portion 20. In the embodiment, the semiconductor substrate 10 is a P-type silicon substrate. The semiconductor substrate 10 includes a P-type well region 12.

The light receiving portion 20 is provided on a surface layer on a surface S1 (a first surface) side of the semiconductor substrate 10. More specifically, the light receiving portion 20 is formed in the P-type well region 12 in the semiconductor substrate 10. The surface 20a of the light receiving portion 20 is silicided. In the embodiment, particularly, the whole surface 20a is silicided. Furthermore, the light receiving portion 20 is an N-type impurity diffusion layer (a first impurity diffusion layer) and forms a P-N junction with the adjacent P-type well region 12.

The solid state imaging device 1 is one in which light from an object to be imaged incident on a back side S2 (a second surface) of the semiconductor substrate 10 is photoelectric-converted inside the semiconductor substrate 10 and the light receiving portion 20 receives electric charge generated by the photoelectric conversion, and the object to be imaged is imaged.

A gate insulating film 32 is formed on the surface S1 of the semiconductor substrate 10. The gate insulating film 32 is provided adjacent to the above mentioned light receiving portion 20. Furthermore, a gate electrode 34 is formed on the gate insulating film 32. A surface 34a of the gate electrode 34 is also silicided. The gate insulating film 32 and the gate electrode 34 are made of oxide silicon and polysilicon, respectively.

Further, an N-type impurity diffusion layer 36 (a second impurity diffusion layer) is formed on the side opposite to the light receiving portion 20, with the gate insulating film 32 and the gate electrode 34 sandwiched. The surface 36a of the N-type impurity diffusion layer 36 is also silicided. The gate insulating film 32, the gate electrode 34, and the N-type impurity diffusion layer 36 constitute a field-effect transistor (FET) together with the light receiving portion 20. In the FET, the gate electrode 34 and the N-type impurity diffusion layer 36 function as a reset gate and a reset drain, respectively. Furthermore, the FET is isolated from other elements by an element isolation region 52. The element isolation region 52 is, for example, a LOCOS (Local Oxidation of Silicon) region or an STI (Shallow Trench Isolation) region.

A source follower amplifier 40 is connected to the light receiving portion 20 via an interconnect 54. The interconnect 54 is interconnect formed in an interconnect layer (not shown in the drawing) on the semiconductor substrate 10. In this regard, however, the interconnect 54 and the source follower amplifier 40 are shown by a circuit diagram in FIG. 1.

The source follower amplifier 40 includes a selective switch FET 42, a detection FET 44, and a load FET 46, which are provided between a power supply terminal ($V_{dd}$) on the high electric potential side and a power supply terminal ($V_{ss}$) on the low electric potential side. More specifically, those FETs are provided in series with each other in the order corresponding to the detection FET 44, the selective switch FET 42, and the load FET 46 from the power supply terminal ($V_{dd}$) toward the power supply terminal ($V_{ss}$) Furthermore, an output terminal 48 of the source follower amplifier 40 is connected to a drain terminal (terminal on the selective switch FET 42 side) of the load FET 46.

Next, operation of the solid state imaging device 1 will be described. First, electric potential of the light receiving portion 20 is reset by applying a high pulse to the gate electrode 34. And then, electric charge generated by the photoelectric conversion is accumulated in the light receiving portion 20 by applying a low pulse to the gate electrode 34. Then, the electric potential of the light receiving portion 20 becomes a value depending on the amount of accumulated electric charge and is outputted from the output terminal 48 of the source follower amplifier 40.

Subsequently, an effect of the solid state imaging device 1 will be described. In the solid state imaging device 1, the surface 20a of the light receiving portion 20 is silicided. Therefore, the photoelectric conversion is not performed and light reached the surface 20a of the light receiving portion 20 through the semiconductor substrate 10 is reflected at the surface 20a. This makes the reflected light reusable and therefore photoelectric conversion efficiency with respect to incident light increases. Accordingly, a solid state imaging device 1 with excellent sensitivity can be realized.

As described above, the silicide formed on the surface 20a of the light receiving portion 20 is used as a reflecting plate, whereby the photoelectric conversion efficiency can be improved while the increase of manufacturing process of the solid state imaging device 1 is suppressed.

By the way, even in the solid state imaging device disclosed in Japanese Laid-open patent publication Nos. H3-296280, H2-285683, a metal reflecting film capable of functioning as such reflecting plate is provided. However, in this case, a process for forming the metal reflecting film needs to be added and therefore the manufacturing process is increased.

Additionally, the metal reflecting film is provided on the semiconductor substrate via an insulating film and therefore the metal reflecting film is isolated from a photoelectric conversion region. Therefore, reuse efficiency of the light passed through the photoelectric conversion region is reduced by light absorption, scattering, and the like in a region (in this case, the insulating film) between the photoelectric conversion region and the metal reflecting film. From this standpoint, in the solid state imaging device 1, the silicide functioning as the reflecting plate is provided adjacent to the photoelectric conversion region and therefore the light passed through the photoelectric conversion region can be reused with high efficiency. Thereby, as described above, the photoelectric conversion efficiency increases and the solid state imaging device 1 with excellent sensitivity can be realized.

In addition, the solid state imaging device disclosed in included Japanese Laid-open patent publication Nos. H3-296280 and H2-285683 also provides with a silicide. However, the silicide is used as the photoelectric conversion region itself and it does not function as the above described reflecting plate. That is, in order to image, the solid state imaging device in such documents needs a first photoelectric conversion region made of metal and a second photoelectric conversion region in ohmic contact with thereto. Therefore, the silicide is provided for the first photoelectric conversion region.

On the other hand, in the solid state imaging device 1, the semiconductor substrate 10 and the light receiving portion 20 serve as the photoelectric conversion region and it differs in imaging principle from that of the solid state imaging device disclosed in the above mentioned documents. As for difference in the imaging principle, it predominates from the point where the imaging principle of the solid state imaging device 1 has a wider wavelength region of usable light. That is, the solid state imaging device disclosed in the above mentioned documents can use only, mainly infrared light; whereas the solid state imaging device 1 can use incident light selected from a wide range of wavelength range between visible light and infrared light.

Furthermore, in also the solid state imaging device disclosed in Japanese Laid-open patent publication No. 2000-77641, a silicide is provided on the surface of the light receiving portion. However, the solid state imaging device is of the surface incident type and therefore the silicide cannot be used as a reflecting plate which reflects the light passed through a photoelectric conversion region in the semiconductor substrate. The silicide would rather reflect light incident on the semiconductor substrate. Therefore, the more it increases in area proportion of a portion covered with the silicide in the surface of the light receiving portion the more photoelectric conversion efficiency reduces. In fact, in the solid state imaging device disclosed in the same document, only circumference of the surface of the light receiving portion is silicided in order to prevent it from lowering the photoelectric conversion efficiency.

In the solid state imaging device 1, the whole surface 20a of the light receiving portion 20 is silicided, whereby the photoelectric conversion efficiency can be further increased as compared with the case where only a portion of the surface 20a is silicided. The reason is that, in the back side incidence type solid state imaging device 1, the more it increases in area proportion of a portion covered with the silicide in the surface 20a of the light receiving portion 20, the more photoelectric conversion efficiency increases. Besides, the case where the whole surface 20a is silicided is simpler in manufacturing process than the case where only a part is silicided. In this regard, however, it is not fundamental that the whole surface 20a is silicided, but only the part thereof may be silicided.

The light receiving portion 20 is an impurity diffusion layer which forms a PN junction with the adjacent semiconductor substrate 10 (the P-type well region 12). This can realize the solid state imaging device with a simple configuration.

The light receiving portion 20, the gate insulating film 32, the gate electrode 34, and the N-type impurity diffusion layer 36 constitute an FET, whereby a structure for resetting electric potential of the light receiving portion 20 can be realized with a simple configuration.

The surface 34a of the gate electrode 34 and the surface 36a of the N-type impurity diffusion layer 36 are silicided. This makes the surfaces 34a and 36a low resistance and therefore an FET suitable for fast operation can be obtained. In addition, in the manufacturing process of the solid state imaging device 1, it is preferable that silicidation of the surface 20a of the light receiving portion 20 is performed at the same time of the silicidation of the surfaces 34a and 36a.

Figure 2:
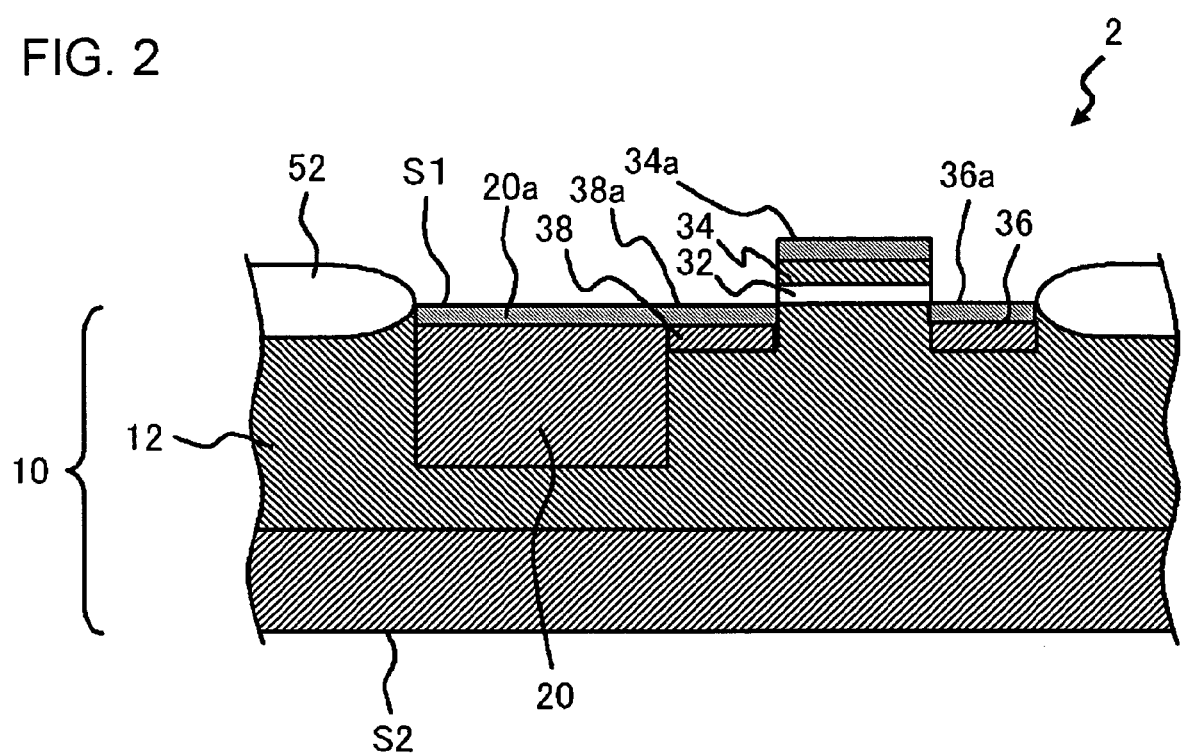
FIG. 2 is a cross-sectional view showing a solid state imaging device according to a modified example of the embodiment.

In addition, the solid state imaging device according to the present invention is not limited to the above mentioned embodiments, but various modifications can be made. FIG. 2 is a cross-sectional view showing a solid state imaging device according to a modified example of the above mentioned embodiment. The solid state imaging device 2 includes a semiconductor substrate 10 and a light receiving portion 20. The solid state imaging device 2 is also one in which light from an object to be imaged incident on the back side S2 of the semiconductor substrate 10 is photoelectric-converted inside the semiconductor substrate 10 and the light receiving portion 20 receives electric charge generated by the photoelectric conversion, and the object to be imaged is imaged. The configuration of the semiconductor substrate 10 and the light receiving portion 20 is the same as described in the solid state imaging device 1.

In the solid state imaging device 2, an N-type impurity diffusion layer 38 (a third impurity diffusion layer) is formed on a surface layer on a surface S1 side of the semiconductor substrate 10. The N-type impurity diffusion layer 38 is provided adjacent to the light receiving portion 20. Furthermore, a gate insulating film 32 is formed adjacent to the N-type impurity diffusion layer 38 on the surface S1 of the semiconductor substrate 10. The gate electrode 34 is formed on the gate insulating film 32. Further, an N-type impurity diffusion layer 36 is formed on the side opposite to the N-type impurity diffusion layer 38, with the gate insulating film 32 and the gate electrode 34 sandwiched. Each of a surface 38a of the N-type impurity diffusion layer 38, a surface 34a of the gate electrode 34, and a surface 36a of the N-type impurity diffusion layer 36 is silicided.

The N-type impurity diffusion layer 38, the gate insulating film 32, the gate electrode 34, and the N-type impurity diffusion layer 36 constitute an FET. In also the FET, the gate electrode 34 and the N-type impurity diffusion layer 36 function as a reset gate and a reset drain, respectively. In addition, operation and effect of the solid state imaging device 2 are the same as those of the above mentioned solid state imaging device 1.

It is apparent that the present invention is not limited to the above embodiment, that may be modified and changed without departing from the scope and spirit of the invention.

What is claimed is:

1. A solid state imaging device, comprising:
   a semiconductor substrate; and
   an impurity diffusion layer disposed on a surface layer on a first surface side of said semiconductor substrate, a surface of the impurity diffusion layer, which includes at least a surface adjacent to a gate electrode, being silicided,
   wherein said impurity diffusion layer includes a light receiving portion disposed on the surface layer on said first surface side of said semiconductor substrate, a surface of the light receiving portion being silicided, and
   wherein light from an object to be imaged incident on a second surface of said semiconductor substrate is photoelectric-converted inside said semiconductor substrate, said light receiving portion receives electric charge generated by said photoelectric conversion, and said object to be imaged is imaged.

2. The solid state imaging device as set forth in claim 1, wherein an entire surface on one side of said light receiving portion is silicided.

3. The solid state imaging device as set forth in claim 1, wherein said light receiving portion is a first impurity diffusion layer which forms a P-N junction with said semiconductor substrate.

4. The solid state imaging device as set forth in claim 1, further comprising:
   a gate insulating film which is provided adjacent to said light receiving portion on said first surface of said semiconductor substrate;
   the gate electrode being provided on said gate insulating film; and
   a second impurity diffusion layer which is provided on a side opposite to said light receiving portion, with said gate insulating film and said gate electrode sandwiched,
   wherein said light receiving portion, said gate insulating film, said gate electrode, and said second impurity diffusion layer constitute a field-effect transistor.

5. The solid state imaging device as set forth in claim 4, wherein a surface of said second impurity diffusion layer is silicided.

6. The solid state imaging device as set forth in claim 1, further comprising:
   a second impurity diffusion layer which is provided adjacent to said light receiving portion on said surface layer on said first surface side of said semiconductor substrate;
   a gate insulating film which is provided adjacent to said second impurity diffusion layer on said first surface of said semiconductor substrate;
   the gate electrode being provided on said gate insulating film; and
   a third impurity diffusion layer which is provided on a side opposite to said second impurity diffusion layer, with said gate insulating film and said gate electrode sandwiched,
   wherein said second impurity diffusion layer, said gate insulating film, said gate electrode, and said third impurity diffusion layer constitute a field-effect transistor.

7. The solid state imaging device as set forth in claim 6, wherein surfaces of said second and said third impurity diffusion layers are silicided.

8. The solid state imaging device as set forth in claim 4, wherein a surface of said gate electrode is silicided.

9. The solid state imaging device as set forth in claim 1, wherein a p-type well region is disposed between the light receiving portion and the second surface of said semiconductor substrate.

10. The solid state imaging device as set forth in claim 1, wherein the impurity diffusion layer comprises an N-type impurity diffusion layer.

11. The solid state imaging device as set forth in claim 9, wherein the impurity diffusion layer comprises an N-type impurity diffusion layer and forms a P-N junction with the adjacent P-type well region.

12. The solid state imaging device as set forth in claim 1, wherein the silicided surface of the light receiving portion comprises a surface of the light receiving portion opposite the second surface of said semiconductor substrate.

13. The solid state imaging device as set forth in claim 1, wherein the surface of the impurity diffusion layer, which includes at least the surface adjacent to the gate electrode, abuts the gate electrode.

14. The solid state imaging device as set forth in claim 1, wherein the surface adjacent to the gate electrode is adjacent to the gate electrode in a direction perpendicular to a thickness direction of the impurity diffusion layer.

* * * * *